United States Patent [19]

Simila et al.

[11] Patent Number: 5,389,743
[45] Date of Patent: Feb. 14, 1995

[54] RIVET DESIGN FOR ENHANCED COPPER THICK-FILM I/O PAD ADHESION

[75] Inventors: Charles E. Simila; Mradul Mehrotra, both of Tucson, Ariz.

[73] Assignee: Hughes Aircraft Company, Los Angeles, Calif.

[21] Appl. No.: 993,544

[22] Filed: Dec. 21, 1992

[51] Int. Cl.[6] .............................................. H05K 1/02
[52] U.S. Cl. .................................. 174/262; 174/263; 174/255; 361/773; 361/776
[58] Field of Search ............... 174/262, 263, 265, 266, 174/250, 255; 361/773, 776

[56] References Cited

U.S. PATENT DOCUMENTS

| | | | |
|---|---|---|---|
| 3,888,639 | 6/1975 | Hashings et al. | 174/263 X |
| 4,268,585 | 5/1981 | Daur et al. | 174/261 X |
| 4,628,410 | 12/1986 | Goodman et al. | 361/413 |
| 4,713,494 | 12/1987 | Oikawa et al. | 174/262 X |
| 5,035,939 | 7/1991 | Conlon et al. | 428/137 |
| 5,111,003 | 5/1992 | Kimbara | 174/255 |
| 5,239,448 | 8/1993 | Perkins et al. | 174/266 X |

Primary Examiner—Leo P. Picard
Assistant Examiner—L. Thomas
Attorney, Agent, or Firm—Charles D. Brown; Randall M. Heald; Wanda K. Denson-Low

[57] ABSTRACT

A ceramic circuit card (10) for a missile utilizing a "rivet" design and a method for making the same wherein thick-film copper I/O pads (15) are fabricated on a first dielectric layer (13) and on the upper surface of conducting material (20) in vias (14) formed in the dielectric layer (13). A first conductor layer (11) is printed directly on an alumina ceramic layer (12). The dielectric layer (13) is then printed on the first conductor layer (11) and on the alumina ceramic layer (12). During operation, each I/O pad (15) has attached to it a flex harness (21) for connecting the card (10) to a printed wiring board (22) on which the card (10) is mounted. The ceramic circuit card (10) is further comprised of additional dielectric and conductor layers in an alternating stacked arrangement. The top conductor layer is used to connect the circuit card to other electrical components.

7 Claims, 3 Drawing Sheets

RIVET DESIGN FOR ENHANCED COPPER THICK-FILM I/O PAD ADHESION

This invention was made with U.S. Government support under Contract No. F08635-87-C-0070 awarded by the Department of the Air Force. The Government has certain rights in this invention.

BACKGROUND OF THE INVENTION

1. Field of the Invention

The invention is directed to an improved ceramic circuit card construction and a method for producing such a card. The improved ceramic circuit card provides increased adhesion strength for circuit pads fabricated thereon, and in particular copper input/output (I/O) circuit pads which are fabricated on dielectric layers of the circuit card and make use of multiple vias filled with conducting material to increase adhesion.

2. Description of Related Art

Ceramic circuit cards are complex, multi-layered circuits and include multiple I/O circuit pads that are fabricated onto an alumina ceramic base layer using thick-film copper inks. Such circuit cards are often employed as sensing, guiding or radar circuits in projectiles such as missiles where the cards are subjected to high and low temperature extremes as well as considerable shock and vibration. The ceramic circuit cards must have sufficient adhesion strength to withstand these conditions.

On conventional thick-film ceramic circuit cards, copper I/O pads are fabricated directly on relatively large area alumina ceramic. With this construction, the adhesion strength of the I/O pads on the ceramic is dependent upon the nature of the mechanical and chemical bond at the copper ink-to-ceramic interface. During the fabrication of the multiple circuit layers, these cards are repeatedly exposed to furnace temperatures of approximately 900° Celsius, often causing the copper ink-to-ceramic adhesion to degrade to undesirable levels. Exposure of fabricated cards to plating chemistry whereby the cards are further processed by plating them with nickel and gold to make them more solderable may also act to reduce I/O pad adhesion.

Due to the loss of adhesion strength during the fabrication process, the finished ceramic cards do not consistently exhibit sufficiently high average tensile pull adhesion characteristics for use of the ceramic cards in extremely high and low temperatures and in high vibration environments. Moreover, with the previous design and manufacturing process, there is a distinct possibility that variations in the manufacturing process will result in some lots of cards being produced having I/O pad adhesion distributions below the minimum level, thus increasing the risk that these I/O pads will peel off of the ceramic during assembly, testing or in flight.

It is, therefore, an object of this invention to overcome one or more of these problems.

SUMMARY OF THE INVENTION

The invention is embodied in an improved ceramic circuit card construction comprised of an alumina ceramic layer and a conductor layer printed directly on the alumina ceramic layer. A dielectric layer having a plurality of vias filled with a conducting material is printed on the conductor layer. In accordance with the invention, at least one circuit pad is printed on the dielectric layer and the conducting material. The circuit pad may be an input/output circuit pad made of thick-film copper material.

A second embodiment of the invention is adapted to be embodied in a method for adhering a circuit pad to a ceramic layer which method comprises the steps of adhering a conductor layer directly to the ceramic layer, adhering a dielectric layer having a plurality of vias to the conductor layer, filling the vias with a conducting material, and adhering a circuit pad to the dielectric layer and to the conducting material in the vias.

DESCRIPTION OF THE PREFERRED EMBODIMENTS

Figure 1:
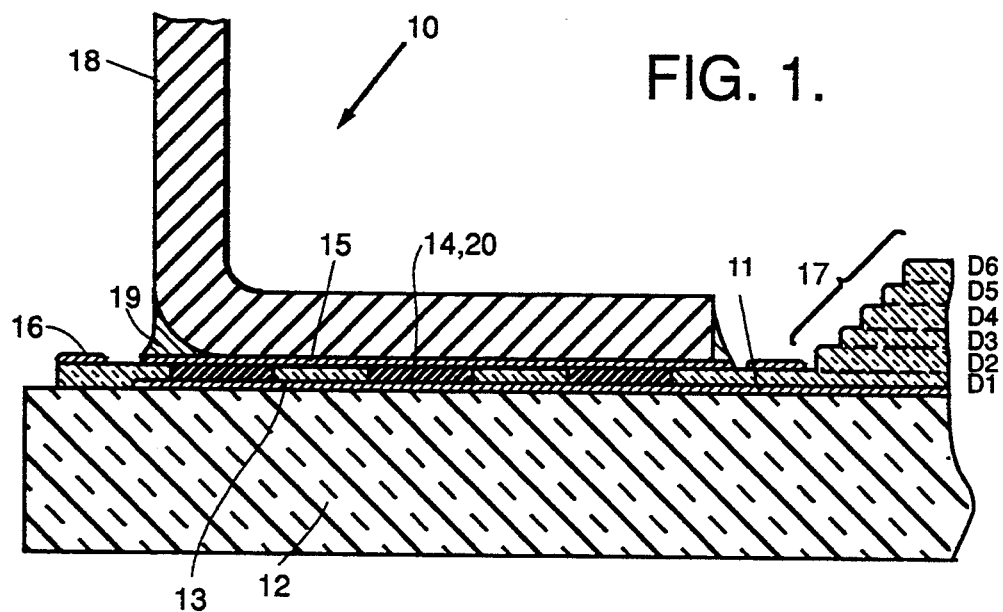
FIG. 1 is a side view of a ceramic circuit card with portions shown in cross section and constructed in accordance with the embodiments of the invention.

Referring now to the drawings in more detail, FIGS. 1 through 4 illustrate the various layers of a ceramic circuit card, identified generally by the reference numeral 10. The ceramic cards themselves are usually about eight to nine inches by four to five inches and forty thousandths of an inch thick without the circuit layers. Once the layers are fabricated on the ceramic, the thickness of the card will increase to between fifty five and seventy five thousandths of an inch, depending on the number of conductor and dielectric layers there are.

Figure 3:
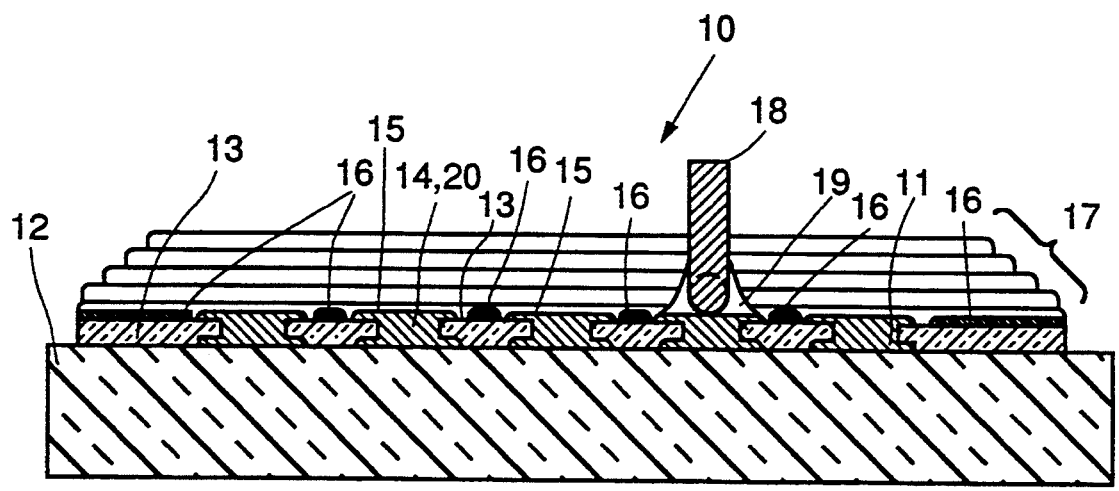
FIG. 3 is a front view of the ceramic circuit card shown in FIG. 2 with portions shown in cross section.

As shown in FIGS. 1 and 3, a first copper conductor layer identified by the reference numeral 11 is printed directly on an alumina ceramic base 12 using a known screen printing process. Generally, this process comprises placing a thick-film copper paste onto the base 12, drying out low boiling temperature solvents and then sintering by raising the temperature up to 900° Celsius.

Once the copper conductor layer 11 is in place, a first layer of dielectric ink indicated by the reference numeral 13 (and also by the designation D1 in FIG. 1) is fabricated onto the copper layer 11. This dielectric ink layer 13 is made of glass and alumina and is printed on the copper conductor layer 11 and on the alumina ceramic base 12 using the known screen printing process. The dielectric ink 13 is initially in the form of a paste, and during the initial placing of this dielectric ink paste 13 onto the copper layer 11 and onto the alumina ceramic base 12, a plurality of via openings 14 are formed in the paste 13. These via openings 14 are very small holes approximately twenty thousandths of an inch square in surface area, formed by the presence of discrete masks on the dielectric screen printing tool which act to prevent the flow of dielectric paste into the areas where via openings 14 are desired. To insure that the vias 14 are properly formed, the consistency of the dielectric ink paste 13 should be thick enough so that it does not run into the vias 14 after they are formed.

After the via openings 14 are formed, they are filled with a conductive copper viafill material 20 using a viafill screen printing tool having masking which permits ink flow only into those areas where via openings 14 were formed during printing of the previous dielectric print. The copper viafill ink has expansion and contraction properties which match those of the dielectric layer 13. This is to insure that the copper conducting material 20 adheres to the walls of the vias 14 during the expansion and contraction of the dielectric layer 13 which will occur as the ceramic circuit card 10 undergoes temperature changes.

In the illustrated embodiments, copper input/output (I/O) circuit pads 15 are then adhered to the dielectric layer 13 and the copper conducting material 20 in the vias 14 using thick film copper ink and the known screen printing process. With this construction, the copper-to-copper ink bonds at the vias 14 provide most of the adhesion improvement. Additional adhesion is provided by the copper-to-dielectric interface adjacent the via conductors. Thus, the amount of adhesion strength will depend to a large extend on the number of via filled conductors which will, in turn, depend on the particular application of the card 10.

The visual appearance of a cross-section taken through a typical via 14 in the completed dielectric layer 13 is similar to that of a rivet binding together discrete layers of material. For the purpose of illustrating the invention, the construction is referred to as a "rivet" design. Repeated exposure of the "rivet" design ceramic card 10 to furnace firing temperatures during fabrication has no significant effect on adhesion of the I/O pads 15, since adhesion strength is provided by the nature of the via construction and the adhesion of the I/O pads 15 to the dielectric layer 13. The conductor layer 11 on the ceramic base 12 which experienced adhesion degradation in the conventional card design is covered by dielectric material 13 in the "rivet" design which masks the conductor layer 11 from the deleterious effects of the furnace atmosphere during repeated firing and provides additional adhesion strength by its presence.

Figure 2:
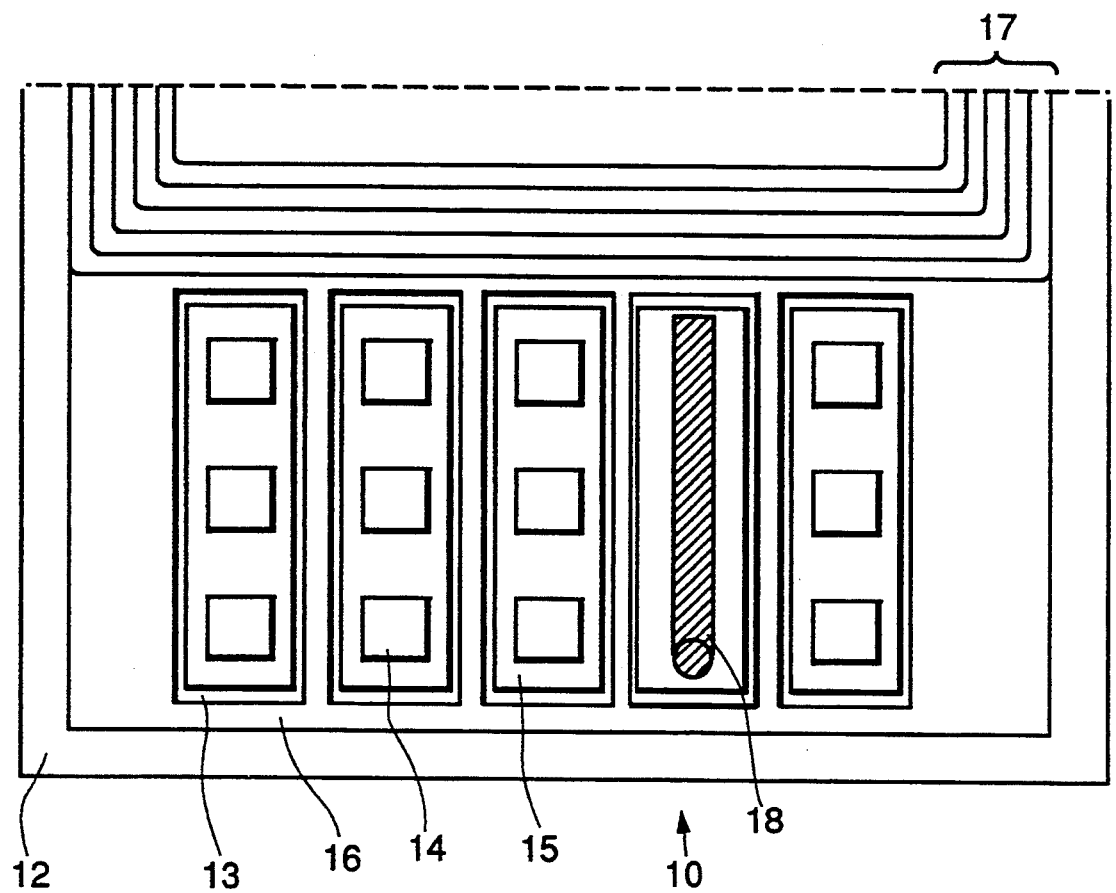
FIG. 2 is a top view of the ceramic circuit card with portions shown in cross section.

After the I/O circuit pads 15 are in place, a seal glass layer 16 is screen printed on the first dielectric layer 13 around each of the I/O pads 15 as shown in FIG. 2. The seal glass layer 16 makes the circuit hermetic and therefore impervious to moisture.

The circuit card 10 is further comprised of a plurality of additional copper conductor layers (not shown), and dielectric ink layers identified generally by the reference numeral 17. The additional dielectric ink layers 17 are also individually designated by D1 through D6 in FIG. 1. The second conductor layer is printed on the first dielectric layer D1. Alternating layers of dielectric ink and conductor layers are then screen printed one on top of the other with the second dielectric layer D2 being screen printed on the second conductor layer.

Figure 5:
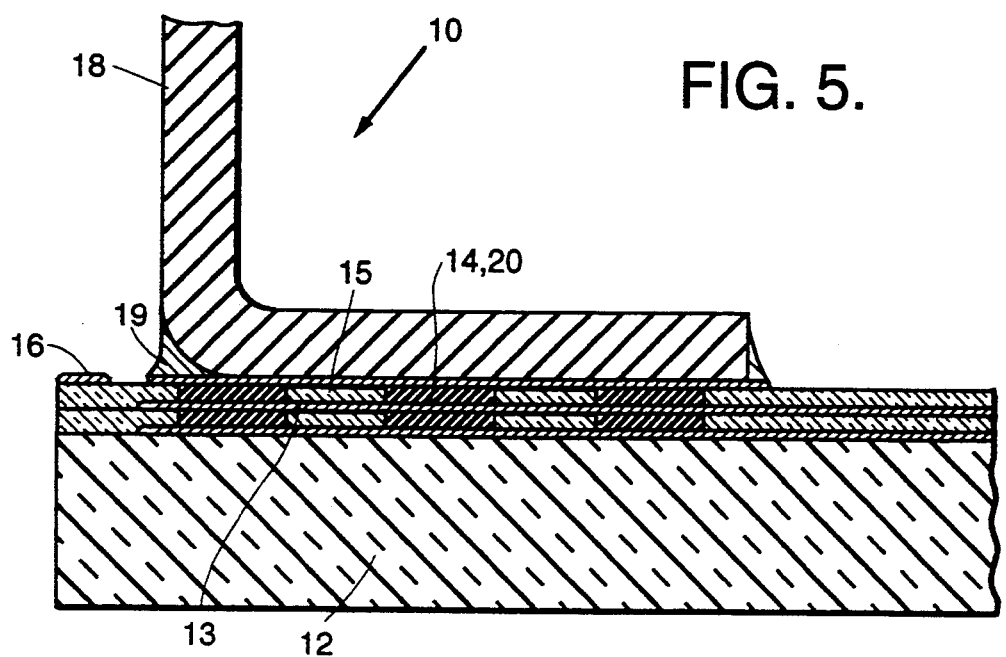
FIG. 5 is a cross section of an alternate embodiment showing alternating layers of a) conductor and b) dielectric with vias filled with conductive copper viafill.

FIG. 5 shows a detailed cross section of an embodiment of the invention having two layers of conductor material alternating with two layers of dielectric with conductor filled vias.

The illustrated circuit card 10 of FIG. 1 contains six dielectric layers. However, some applications may require one or two more layers, in which case there would be seven or eight additional dielectric layers 17. Whatever the number of additional dielectric layers 17, the top conductor layer should be surrounded by a seal glass layer (not shown) which is screen printed on the top dielectric layer much like the seal glass layer 16 which is printed on the first dielectric layer 13 around each I/O pad 15. The seal glass layer around the top conductor layer serves the same function as the seal glass layer 16.

The top conductor layer is exposed so that other components such as leadless chip carrier, capacitor or hybrid circuit pads may then be soldered to the top copper conductor layer.

To test the adhesion strength of the I/O circuit pads 15, one end of a pull test wire 18 may be adhered to each of the I/O circuit pads 15 by means of solder 19 as shown in the drawing figures. The other end of the pull test wires 18 extend upwardly and may be attached to a testing machine which measures the adhesion strength of the I/O pads 15 by pulling the test wires 18.

In design tests, in which the electrical functionality and adhesion characteristics were tested, ceramic circuit cards fabricated using the "rivet" design provided I/O pad adhesion of 2.0 pounds minimum, 4.3 pounds average tensile pull. This is well in excess of Advanced Medium Range Air to Air Missile (AMRAAM) requirements of 1.0 pound minimum, 2.0 pound average tensile pull strengths. Additional manufacture tests were performed on ceramic circuit cards produced in volume. Eleven lots of fifty cards per lot were manufactured and tested. The I/O pad adhesion was 1.6 pounds minimum, 4.5 pounds average tensile pull. All eleven lots exceeded the AMRAAM adhesion requirements.

Figure 4:
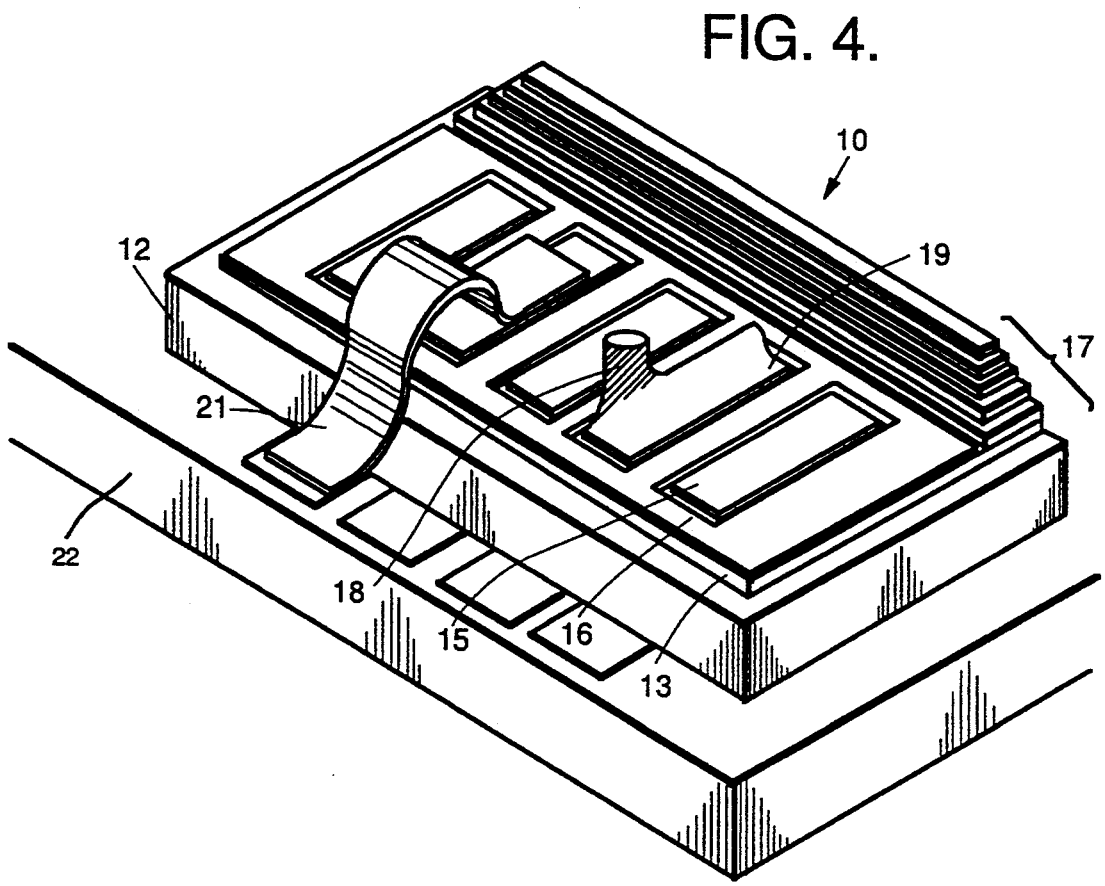
FIG. 4 is a perspective view of the ceramic circuit card.

During use of the ceramic circuit cards, the pull test wires 18 are not used. Instead, an electrical flex harness connector 21 is soldered onto each I/O circuit pad 15. As shown in FIG. 4, a segment at one end of each flex harness 21 is laid flat on an I/O circuit pad 15 and is then soldered to the pad 15. The remainder of each flex harness 21 which is unattached to the pad 15 has a portion that extends upwardly and is then bent downwardly whereafter it extends below the card for connection to a printed wiring board 22 on which the card is mounted, as shown in FIG. 4.

With the new "rivet" design, the increased adhesion of the I/O pads 15 also assures that these electrical flex harness connectors 21 soldered between the ceramic cards and the printed wiring boards will remain more securely attached to the cards than with the previous construction.

The new "rivet" design has another advantage in that it will accommodate existing card designs. Existing cards of the prior construction with copper I/O pads printed directly on ceramic may be easily and cost effectively converted to the "rivet" design configuration by refabricating the I/O pads on dielectric at the second conductor layer. This may be done without added design costs and circuit verification which would be necessary if the I/O pads were moved to the top conductor layer of the circuit card.

Although the invention has been described in conjunction with adhering I/O circuit pads to ceramic cards, it will be understood by those skilled in the art that the invention can be utilized in connection with other types of thick film copper circuit pads that require strong adhesion characteristics. The "rivet" design may also be applicable to non-copper thick film circuit pads which require increased adhesion qualities necessitated by harsher vibration or thermal conditions. The "rivet" design may also be applied to leadless chip carrier or capacitor circuit pads fabricated at the top conductor layer of ceramic cards. The thermal conductivity of a plurality of large cross section viafill conductors used in the "rivet" design may be applied to the dissipation of heat in thick film circuit designs having surface mount or resistive components which generate heat.

It should be readily apparent from the foregoing description that embodiments of an improved ceramic card construction and a method for making the same have been illustrated and described. By using the "rivet" design wherein each I/O pad is placed onto a dielectric layer and the copper material which fills the vias of the dielectric layer increased adhesion strength for the I/O pads is achieved. Although embodiments of the invention have been illustrated and described, various changes and modifications may be made without departing from the spirit and scope of the invention, as defined by the appended claims.

What is claimed is:

1. A structurally secure input/output (I/O) pad for a circuit card comprising:
   an alumina ceramic layer,
   a conductor layer printed directly on said alumina ceramic layer,
   a dielectric layer having a plurality of vias filled with a conducting material printed on said conductor layer,
   at least one input/output pad printed on said dielectric layer and said conducting material, and
   a seal glass layer on said dielectric layer around said input/output pad thereby making the circuit hermetic and impervious to moisture.

2. The circuit card of claim 1, wherein said dielectric layer is dielectric ink printed on said conductor layer and on said alumina ceramic layer.

3. The circuit card of claim 1, wherein said circuit pad is an input/output circuit pad made of thick-film copper material.

4. The circuit card of claim 3, further comprising a pull test wire attached to said circuit pad.

5. The circuit card of claim 4, wherein said pull test wire is soldered to said input/output circuit pad.

6. The circuit card of claim 3, further comprising a flex harness attached to said input/output circuit pad.

7. An input/output (I/O)pad for a circuit card comprising:
   an alumina ceramic layer,
   a plurality of conductor layers printed on said alumina ceramic layer,
   a plurality of dielectric layers including a top dielectric layer, each having a plurality of vias filled with a conducting material, one being printed on each of said conductor layers,
   at least one input/output pad printed on said top dielectric layer and said conducting material, and
   a seal glass layer on said dielectric layer around said input/output pad thereby making the circuit hermetic and impervious to moisture.

* * * * *